United States Patent [19]
Wright

[11] 3,932,931
[45] Jan. 20, 1976

[54] POST TERMINAL INSERTION METHOD AND APPARATUS

[75] Inventor: Robert Charles Wright, Huntingdon Valley, Pa.

[73] Assignee: Elco Corporation, Willow Grove, Pa.

[22] Filed: June 12, 1974

[21] Appl. No.: 478,692

Related U.S. Application Data

[62] Division of Ser. No. 368,448, June 8, 1973, Pat. No. 3,837,063.

[52] U.S. Cl. ............... 29/626; 29/203 R; 29/203 B; 29/203 DT; 29/203 DS; 29/203 P; 29/208 F
[51] Int. Cl.² .................. H05K 13/02; H05K 13/04
[58] Field of Search .............................. 29/625–626, 29/628, 525, 203 R, 203 B, 203 DT, 203 DS, 203 P, 208 E, 208 F, 211 R, 33 F, 33 K, 33 M, 33 S; 221/70, 71, 73, 87; 227/2, 4, 5, 6, 100, 102, 107, 109, 114, 123, 135, 136, 139

[56] References Cited
UNITED STATES PATENTS

| | | | |
|---|---|---|---|
| 3,538,581 | 11/1970 | Collins et al. | 29/203 B |
| 3,605,237 | 9/1971 | Bakermans | 29/203 B |
| 3,763,540 | 10/1973 | Long | 29/203 B |
| 3,765,075 | 10/1973 | Olney et al. | 29/203 B |
| 3,768,134 | 10/1973 | Reda et al. | 29/203 B |
| 3,797,091 | 3/1974 | Gavin | 29/203 B |

Primary Examiner—C. W. Lanham
Assistant Examiner—Joseph A. Walkowski
Attorney, Agent, or Firm—Burns, Doane, Swecker & Mathis

[57] ABSTRACT

A method and apparatus for direct insertion into a substrate of terminals from a flexible carrier strip releasably supporting the terminals. The strip path of travel toward a terminal removal zone and from that zone is constrained to accomodate strip flexibility and travel without binding while preventing significant strip twisting and transverse and lateral excursion. A guide block assembly establishes that path of travel in first and second channel guide sections where the terminals are deflected strip portions are respectively guided by flanges. During terminal removal, resilient jaws aid in providing uniform deflection of these strip portions. Continuous tension tends to advance the strip, and escapement fingers control strip indexing. A ram assembly, operable after indexing to directly insert the terminal, includes selected gripping inserts cooperable with differently sized terminals. An anvil assembly cooperates with a sensor and an indicator to insure correct substrate orientation relative to the ram assembly.

18 Claims, 18 Drawing Figures

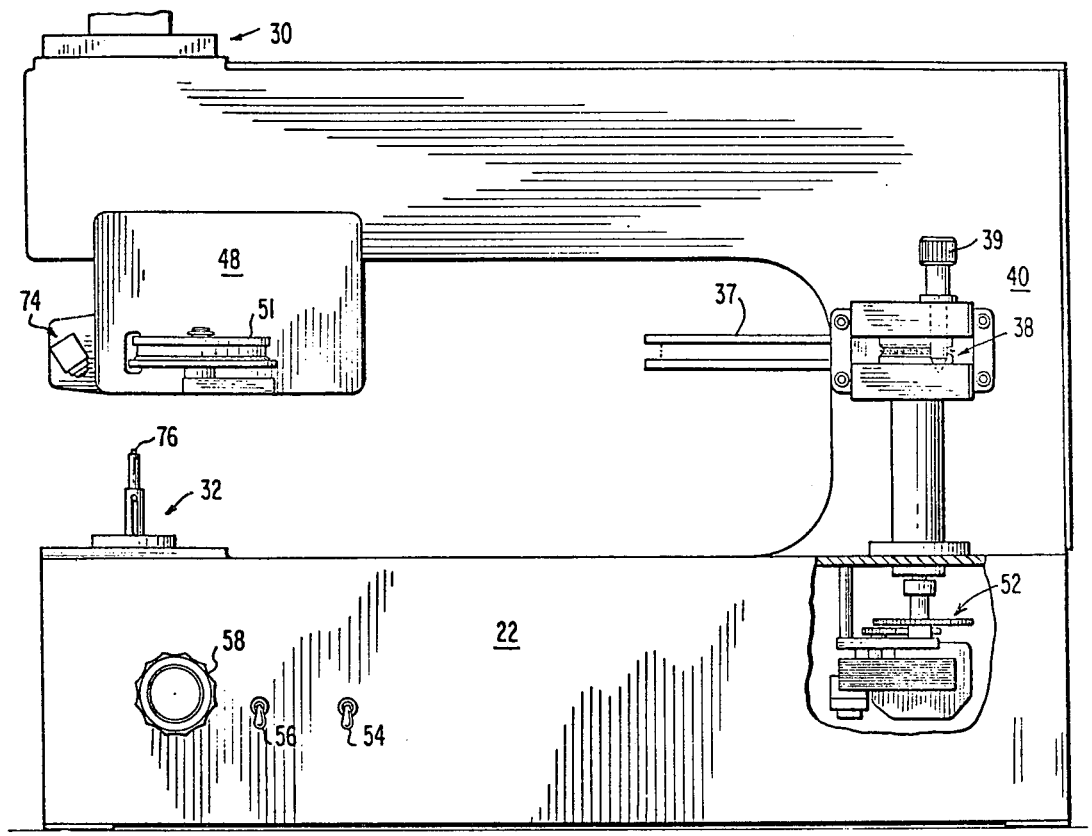
FIG. 2
FIG. 3
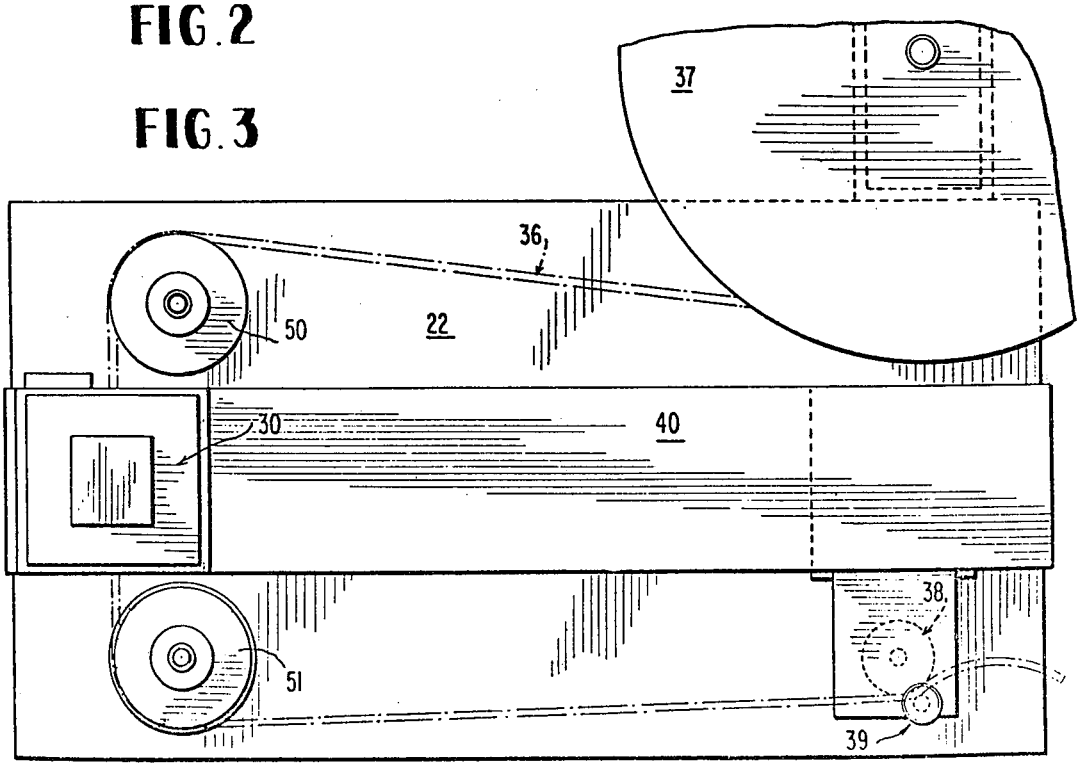

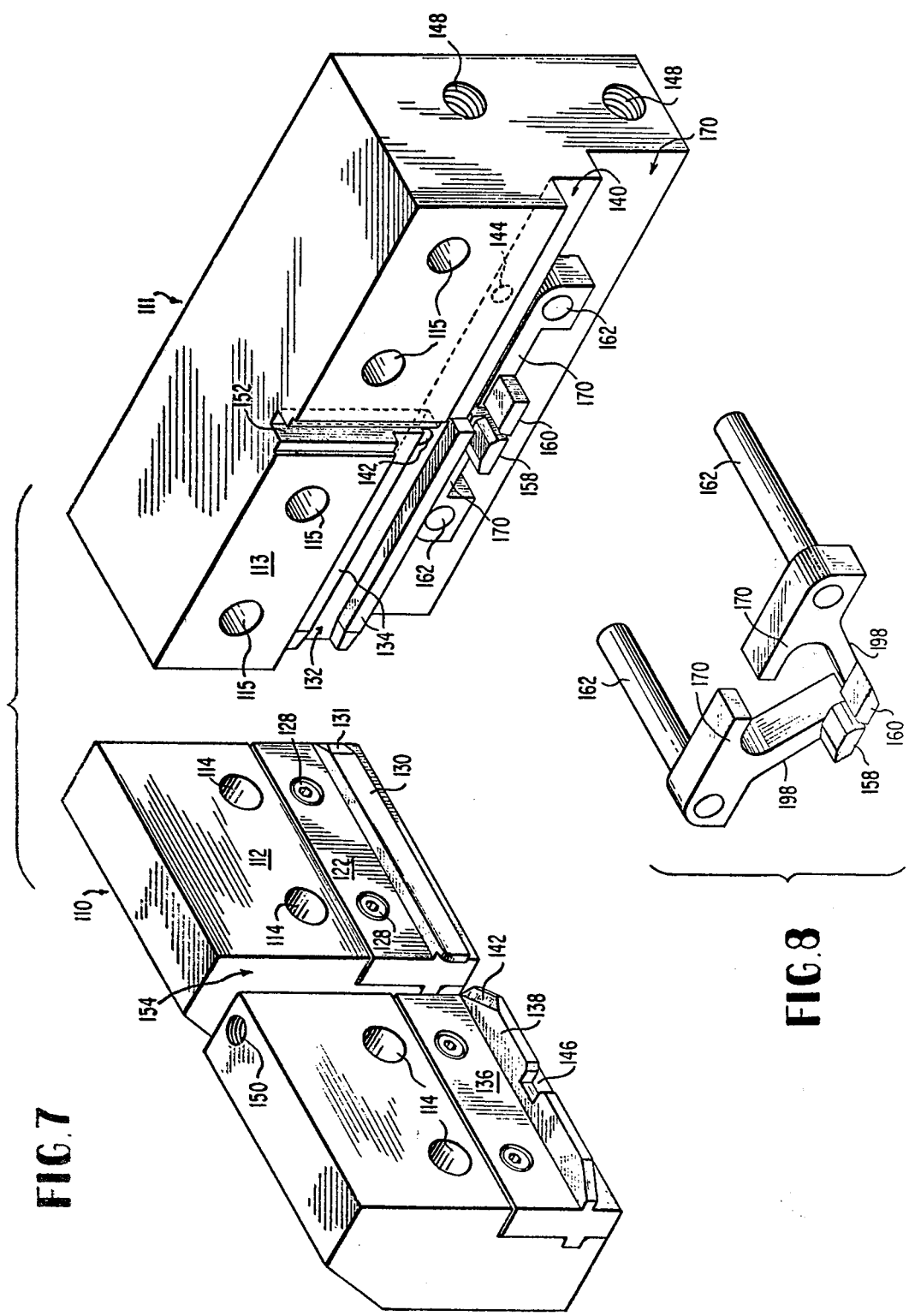

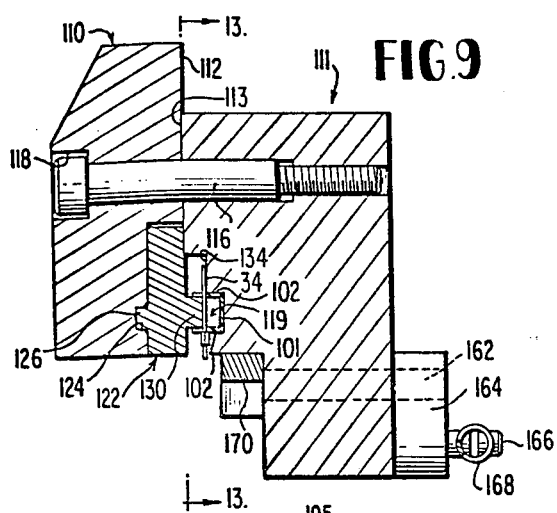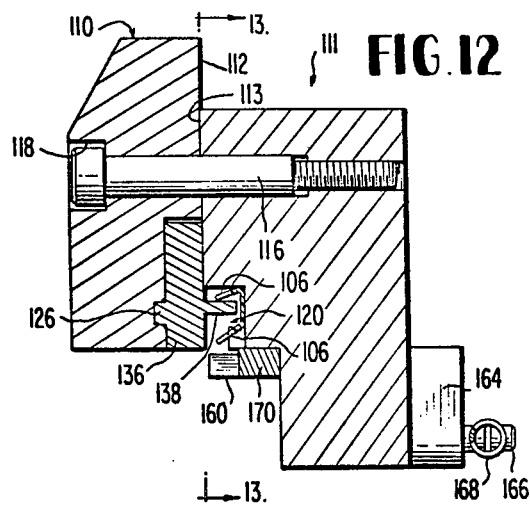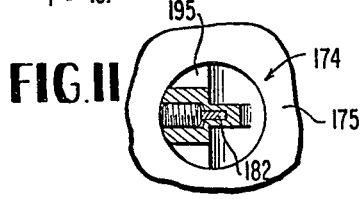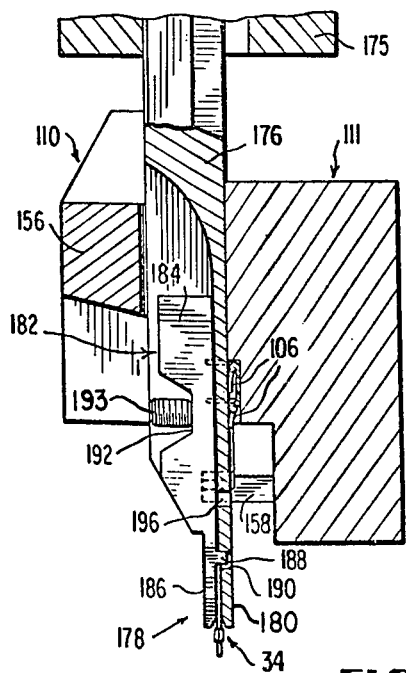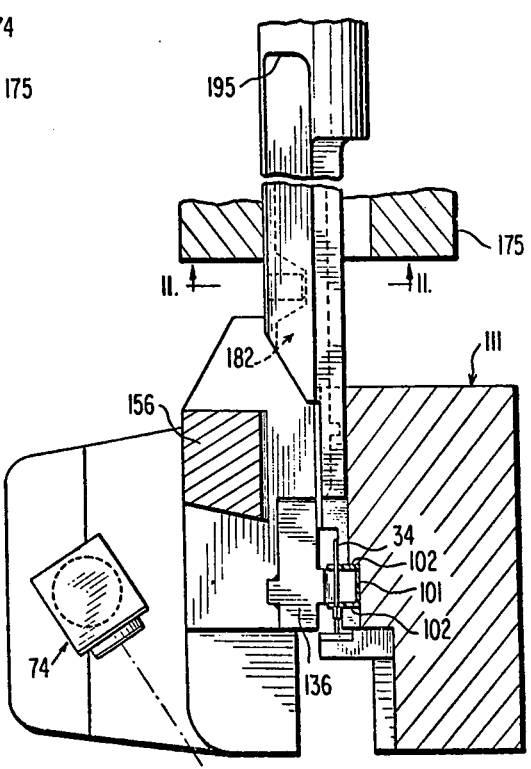

POST TERMINAL INSERTION METHOD AND APPARATUS

This is a division of application Ser. No. 368,448, filed June 8, 1973, now U.S. Pat. No. 3,837,063.

BACKGROUND OF THE INVENTION

This invention relates to a method and apparatus for installing elongate objects such as pin or post terminals on substrates such as printed circuit boards. More particularly, this invention relates to a method and apparatus wherein pins discrete from and removably carried by a flexible plastic carrier strip are directly inserted into a circuit board.

A polyester carrier strip of this type is disclosed in a commonly assigned copending U.S. patent application Ser. No. 288,851, filed Sept. 13, 1972, for "Pin Terminal Carrier Strip". The strip is comprised of an elongate member having a generally U-shaped transverse cross election. The opposite legs of the U-shaped member are provided with aligned carrier slots for holding pins in a generally orthogonal relationship to the strip. Relief slots are also provided in these legs to facilitate transport of the strip by sprocket wheels or the like, while the pins remain seated in the carrier slots. For such transport purposes, the base of the U-shaped member includes indexing apertures cooperable with the sprocket wheels.

In the above-mentioned application, the disclosure of which is hereby incorporated by reference, the carrier strip previously described is discussed in the context of overcoming drawbacks associated with prior pin installation techniques.

One such prior technique is that of manual, individualized installation. This type installation not only is time consuming by reason of the large numbers of pins usually involved and their handling difficulty attributable to size, but also may not be entirely satisfactory from the standpoint of obtaining reliable pin orientation perpendicular to a board without pin damage.

Although some of the problems associated with manual installation may be overcome through prior proposals for automated handling of loose pins with a vibrating hopper or similar arrangement for orienting the pins, it will be appreciated that significant room for improvement exists. Particularly, several drawbacks may be encountered with such arrangements in the areas of the speed of operation, complexities in relation to pin handling once the pins are oriented, etc.

As pointed out in the previously identified application, there have also been prior proposals directed toward providing carrier strips for pin terminals and other types of contacts. However, such proposals may not be entirely acceptable for a variety of reasons.

For example, in some cases heat is required for contact removal. Often the flexibility of the carrier strip is not particularly suited for adequate handling in an automated manner. Disposal costs in connection with some strips made from certain materials may be prohibitive. In addition, complex equipment is often contemplated for removal of the contacts from strips with which the contacts may be integral.

The flexible, easily handled carrier strip of the aforementioned application is intended to aid in overcoming problems of the sort previously noted. In accordance with the teachings of that application, removal of the pins from that strip may be accomplished oy applying a force to the pin either in a direction transverse to the extent of the strip or in an axial direction. With transverse removal, equipment in addition to that used for removal is required for insertion of the pins. With axial removal, a post employed for pin removal may also be used for direct pin insertion. During direct insertion of the pin, the yieldable legs of the U-shaped strip are displaced by the recessed post which embraces the pin and axially translates it into a position of press fit reception in a circuit board hole.

The present invention relates to direct pin insertion of this type. Specifically, the present invention is concerned with retaining the advantages of single stroke pin removal and installation as disclosed in the above noted application, while minimizing or obviating problems associated with such a direct insertion technique.

In this connection, it will be recognized that among the difficulties that might be encountered with automated pin insertion techniques is that of insuring reliably reproducible location of the pins at a pin insertion zone aligned with the circuit board hole to receive the pin. Although the flexibility of a pin carrier strip enhances its handling and transport characteristics, that same flexibility might contribute to misalignment of the pins at the insertion zone, both as an initial matter and during pin insertion. Similarly, where direct insertion is attempted, misalignment problems might result from inadequate provision for carrier strip advancement.

Problems such as these can be somewhat remedied by using equipment separate from the carrier to grip and orient the pins at the insertion zone. However, provision of such equipment could give rise to potentially higher equipment costs and lower operational speeds. Conversely, elimination of such equipment could create other difficulties associated with force and positional relationships between the pin and the members acting on the pin during insertion.

One previous machine of the present assignee, not of the direct insertion type, utilized removal equipment to transversely remove the pins from a carrier strip. This equipment also aided in insuring correct positioning of the pins for insertion. It would, however, be desirable to eliminate the need for such equipment by reason of the earlier noted potentially higher cost and lower operational speed factors, etc. associated therewith.

Moreover, other elements of that machine would not be necessarily compatible with direct insertion techniques. For example, carrier strip guidance by utilizing jaws to grip the base of the generally U-shaped strip could present interference with movement of an insertion ram if direct insertion were attempted. Moreover, these jaws could undesirably rigidify the strip to render it unsuited for both continuous feed and direct insertion without breaking the strip.

In addition, force cooperation between an insertion ram and the pins to be inserted involved, in that machine, the use of sliding blocks that needed to be displaced during continued downward ram movement to effect insertion. The mass of the blocks and control of the block movement through cooperation with an anvil gives rise to the need for controlling several mechanical movements and the possibility of jamming.

Other prior proposals which do relate to direct insertion of pins from a carrier strip are disclosed in Bakermans U.S. Pat. No. 3,605,237, issued Sept. 20, 1971, and in De Shong U.S. Pat. No. 3,307,244, issued Mar. 7, 1967. According to proposals such as these, the carrier may be advanced by incrementally pushing on a metal strip with which the pins are integral. Guidance of the strip along a structurally defined path may be provided. At the insertion location, the pins are gripped by alignment clamps, and a ram and anvil like combination is employed to sever the pin from the strip and insert the pin.

It will be recognized that, although such machines might be desirable for some purposes, the may not be entirely acceptable for a number of reasons. Some of these relate to the particular type carrier strip to which these proposals are essentially restricted, while others are more general in nature.

For example, the need for equipment and sequencing associated with severance of the pins from the strip may present difficulties. Similarly, use of the particular type feeding and guidance techniques for the relatively rigid strip might not be acceptable in the case of a flexible strip such as that with which the present invention is most particularly useful. Pin orientation equipment distinct from the carrier might, as earlier noted, also be undesirable.

Numerous other difficulties associated with carrier strip feeding and handling, pin orientation, and pin insertion can be envisioned.

OBJECTS AND BRIEF SUMMARY OF PREFERRED FORMS OF THE INVENTION

Recognizing the carrier strip feeding and handling, pin orientation, and pin insertion difficulties with removal of a pin from a carrier strip and insertion of the pin into a substrate, it is a general object of the present invention to provide a novel method and apparatus for inserting pins into such a substrate.

It is a particular object of the present invention to provide such a novel method and apparatus especially suited for use in connection with direct pin insertion from flexible carrier strips carrying pins discrete from the strips.

It is a further object of the present invention to provide, in such a method and apparatus, a novel carrier strip guidance technique.

It is an additional object of the present invention to provide, in such a method and apparatus, for strip guidance with novel guide blocks that enhance pin positioning while accomodating strip flexibility.

It is another object of the present invention to provide, in such a method and apparatus, a novel technique for incrementally advancing the carrier strip.

It is yet another object of the present invention to provide, in such a method and apparatus, for incremental carrier strip advancement utilizing an escapement mechanism.

It is a still further object of the present invention to provide, in such a method and apparatus, for novel controlled force relationship between pins and a ram during direct pin insertion from the flexible strip.

It is still another object of the present invention to provide, in such a method and apparatus, for novel cooperation between an anvil assembly and a circuit board to enhance pin alignment with circuit board receiving holes.

Preferred forms of the present invention intended to accomplish at least some of the foregoing objects entail a method and apparatus for direct insertion of terminals from the carrier strip into a substrate. Preferably, this strip is comprised of a flexible elongate member of generally U-shaped cross-section defined by a base portion and contiguous legs. The carrier strip includes a plurality of carrier openings in the leg for releasably mounting a plurality of terminals generally orthogonally to the direction of extent of the strip. The terminals so mounted project outwardly from both legs and along the space defined between these legs. A series of indexing openings are provided in the base portion of the carrier strip.

Apparatus according to the present invention includes in addition to carrier strip feeding means and carrier strip guiding means, a ram assembly and an anvil assembly cooperable with the pins mounted on the carrier strip for removal of those pins from the strip and insertion of the pins into a circuit board. Also included are elements for insuring correct positioning of the pin receiving circuit board relative to the ram assembly and anvil assembly.

Movable ram means of the ram assembly is operable to act on the pins carried by the strip to remove the pins directly from that strip and insert the pins into the substrate or circuit board. This movable ram means includes a pin receiving opening, and means for resiliently gripping the pin within that opening.

The anvil assembly includes movable locating finger means cooperable with the substrate for locating the substrate in a position for reception of the pins acted upon by the ram means. This movable locating finger means is movable between an extended and retracted positions. In the extending position, the locating finger means may be received within a pin receiving aperture of the substrate. In this connection, an indicating means, such as a light source, is operable to provide a visual indication of the reception of the locating finger means in that receiving aperture.

When the locating finger means is displaced from its extended position, such as by engagement with solid portions of the substrate as would occur if the substrate were improperly oriented for pin reception, sensing means is operable to effect disabling of the ram means.

A manually operable substrate mounting fixture may be employed to properly position the substrate for pin reception.

Orientation of the anvil assembly and the ram assembly is such as to establish a pin removal and insertion zone therebetween. Proper orientation of the carrier strip, for pin removal and insertion or movement of the ram means into that pin removal and insertion zone, is provided by carrier strip guiding means.

This guiding means comprises guide block means for establishing the path of travel for said carrier strip in a direction to intersect the pin insertion zone. The guide block means include means defining a ram movement zone in the pin insertion zone, as well as means defining first and second carrier strip guide channel sections along the carrier strip path of travel on opposite sides of that ram movement zone.

The first guide channel is operable to guide a portion of the carrier strip on which the pins are mounted, and includes a generally cross-sectionally U-shaped recess defined by recess wall means having a base and legs. The base and legs are cooperable externally with the base and legs of the carrier strip and those portions of the carrier strip legs that extend from the base to the pins.

Also included in the first guide channel are generally upright wall faces that extend above and below the recess. These wall or track faces respectively cooperate with portions of the pins extending above and below the legs of the carrier strip.

A projecting flange means of the first guide channel is generally cross-sectionally U-shaped and projects toward the guide channel recess. A generally upright face of this projecting flange means is cooperable with the portion of the pins extending between the legs of the carrier strip. Further faces of the projecting flange means are cooperable internally with those portions of the legs of the carrier strip projecting from the pins.

The second guide channel is operable to guide a portion of the carrier strip with the pins removed. The legs of the carrier strip with the pins so removed are deflected in the direction of pin insertion after being acted on by the movable ram means. The second guide channel includes a generally L-shaped recess having a base and an upper leg respectively cooperable with the base of the carrier strip and one of the carrier strip legs adjacent the zone of deflection, at the juncture of that leg and the carrier strip base.

A second projecting flange means projects into the generally L-shaped recess and is cooperable with that leg of the carrier strip adjacent its free end.

Method aspects of the present invention in connection with guidance of the carrier strip entail establishing a constraining guide path for that strip, with the constraint being sufficient to accomodate carrier strip flexibility while preventing significant twisting, pivoting or translation of the strip, and also rigidifying the strip on opposite sides of the ram means movement zone. The orientation between the carrier strip and pins, and the previously mentioned elements of the first and second guide channels cooperable therewith, provide, with limited clearance, the desired constraining relationship.

The carrier strip feeding means includes reel means for supporting the strip for movement along its path of travel. Also included is driven sprocket means cooperable with the indexing openings of the carrier strip to continually bias the strip for movement along that path. Escapement fingers project through openings in the guide blocks for alternating engagement with the indexing openings of the carrier strip on opposite sides of the ram movement zone. The escapement means is operable to provide for sequential advancement into the ram movement zone of pins carried by the strip.

Further method aspects of the present invention involve resisting displacement of the pins from the carrier strip, by a force sufficient to provide generally uniform deflection of those portions of the carrier strip legs that are in the ram movement zone during the movement of the ram which effects removal of the pin from the strip. The resistance force so applied is additionally operable to cause relative movement between the pin and the moving ram means, so that the pin is forced to its limit position gripped within the pin receiving opening of the ram means. At the same time, the resistance force is at a level where undue abrasion of the pins during insertion is avoided.

In the preferred form of the invention, this desired resistance is provided by resiliently biased jaw means having jaw portions mounted for pivotal movement, below the pin path of travel zone, toward and away from the ram movement zone. The jaws also include tapered faces operable to aid in aligning the pin in the direction of its intended path of travel.

Other objects and advantages of the present invention will become apparent from the subsequent detailed description thereof, in connection with the accompanying drawings, in which like numerals refer to like elements, and in which:

THE DRAWINGS

FIG. 2 is a side elevational view of the pin insertion machine shown in FIG. 1, partially broken away to depict the drive employed in connection with take up of the strip serving as a carrier for the pins;

FIG. 3 is a partial top plan view of the insertion machine shown in FIGS. 1 and 2, illustrating in phantom the path of travel of the carrier tape;

Figure 1:
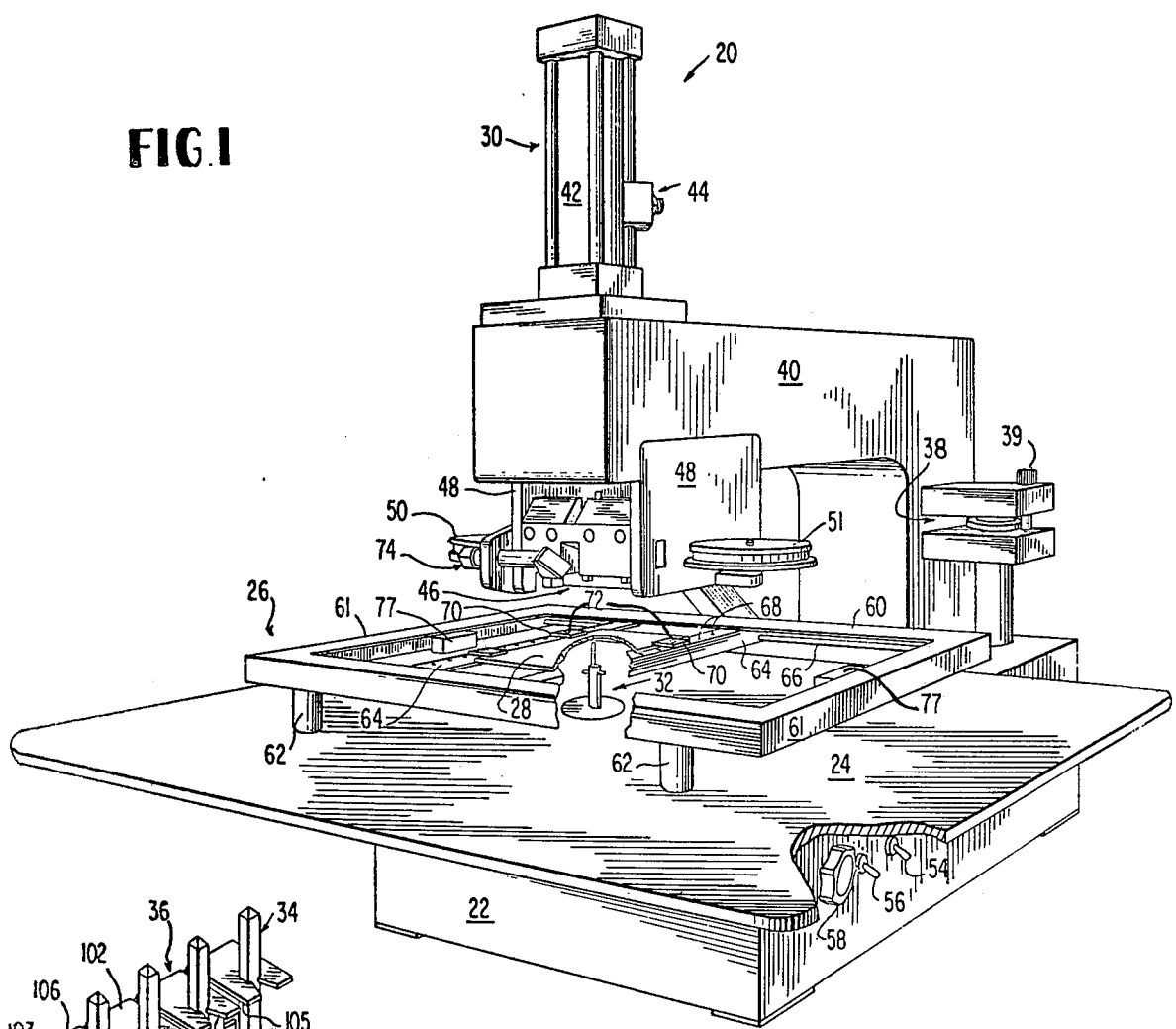
FIG. 1 is a view according to the present invention showing a pin terminal insertion machine in perspective along with a partially broken away perspective illustration of a fixture for holding and orienting circuit board for receiving the pins.
Figure 4:
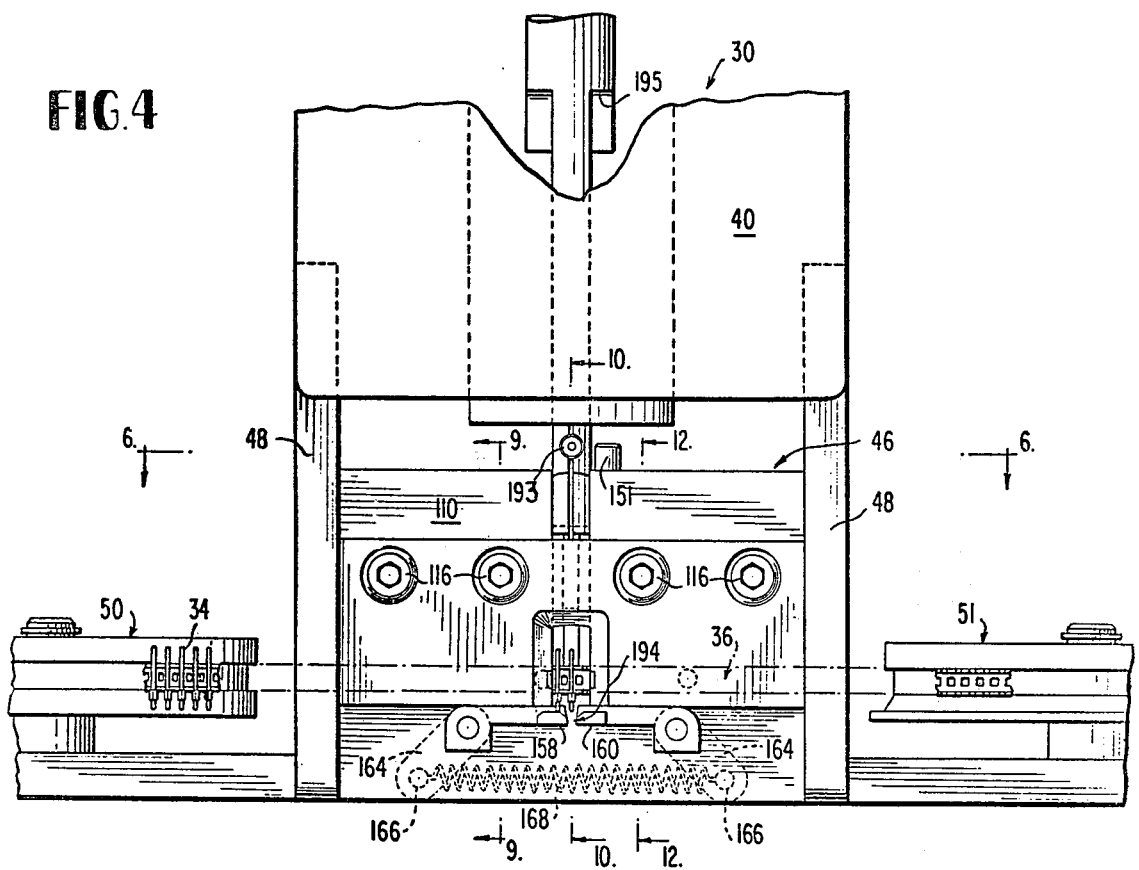
Figure 5:
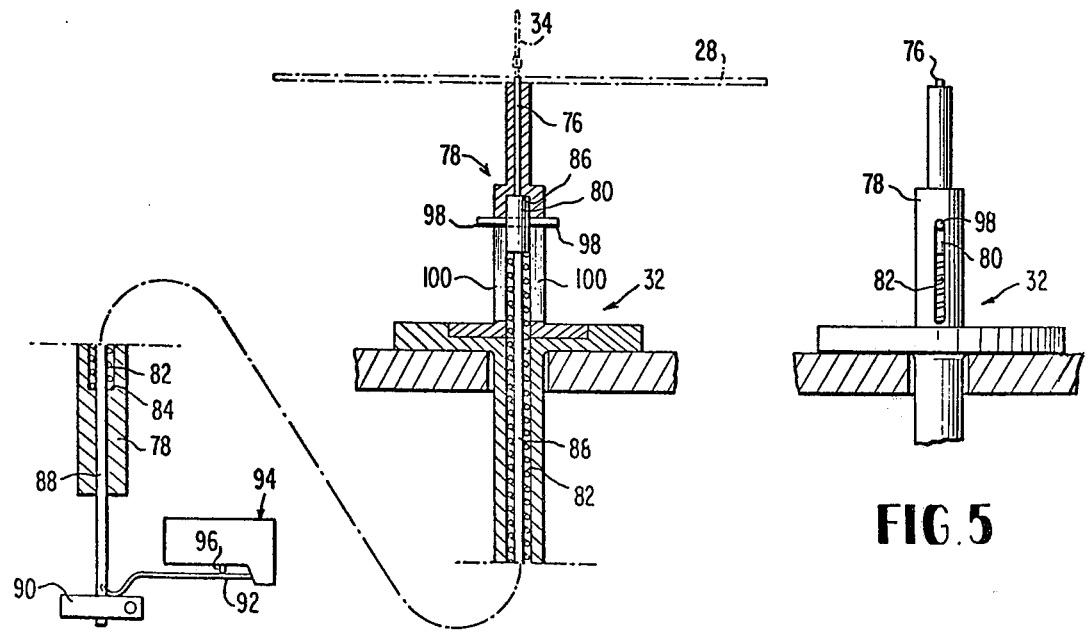

FIG. 4, is a partial front elevational view of the post insertion machine of FIG. 1, illustrating in phantom the carrier strip travelling through guide blocks, showing the orientation of the guide blocks relative to the insertion ram and back-up jaws, and depicting in cross-section the anvil assembly partially shown in FIG. 5, with the orientation of the pin receiving circuit board shown in phantom.

Figure 6:
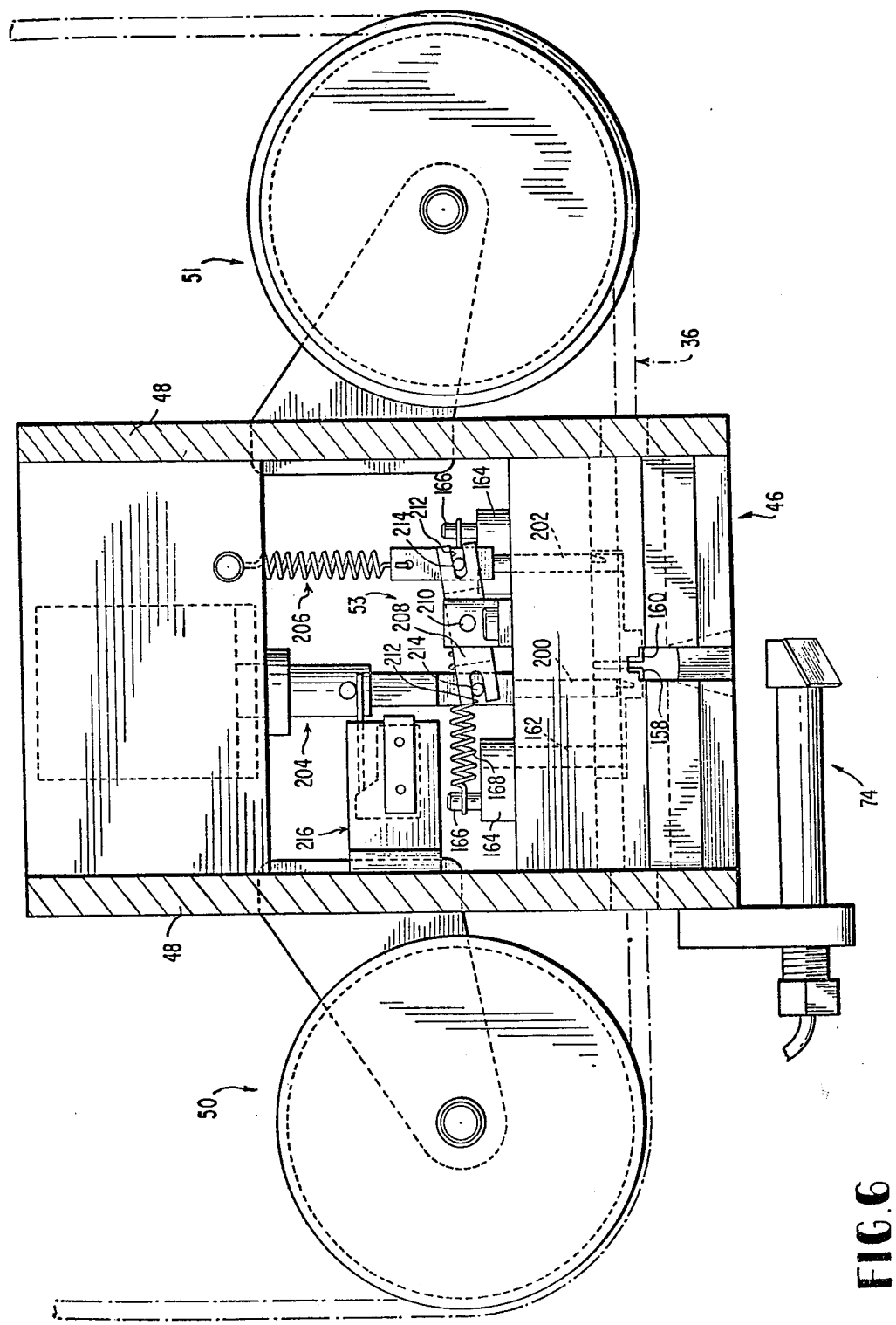

FIG. 5 is a partial side elevational view illustrating the anvil assembly of the insertion machine of FIG. 1;

FIG. 6 is a top plan view taken generally in the direction of line 6—6 in FIG. 4 and illustrating the escapement mechanism utilized for advancement of the carrier strip in the insertion machine of FIG. 1.

Figure 17:
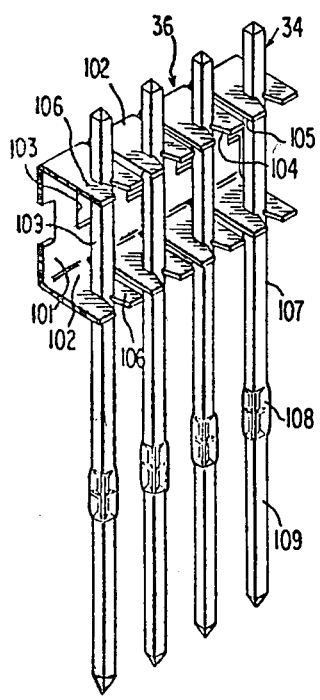
Figure 16:
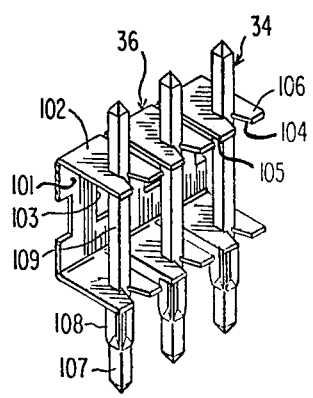
Figure 13:
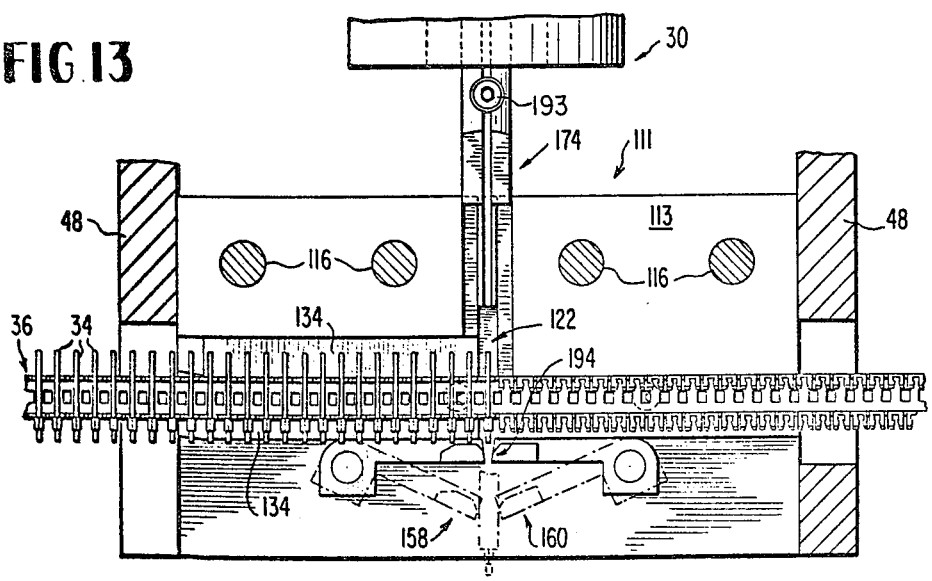
Figure 14:
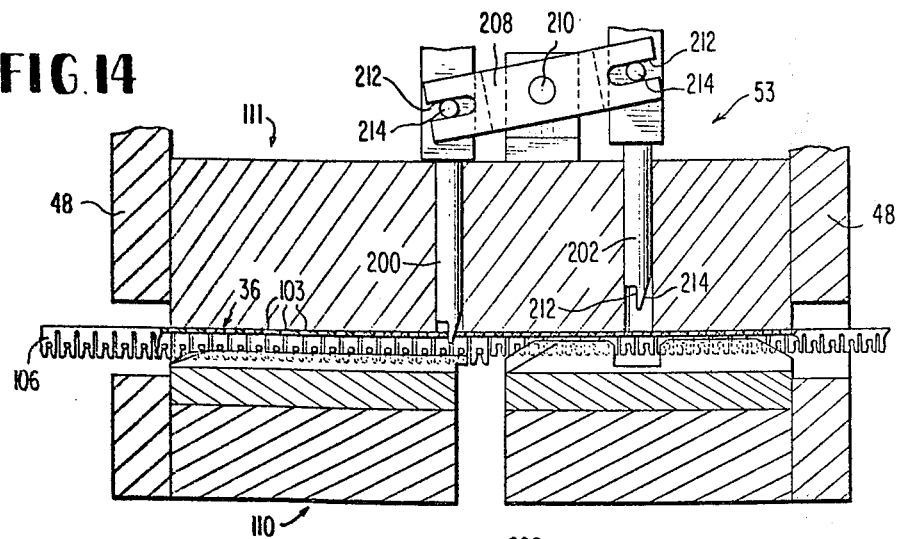
Figure 15:
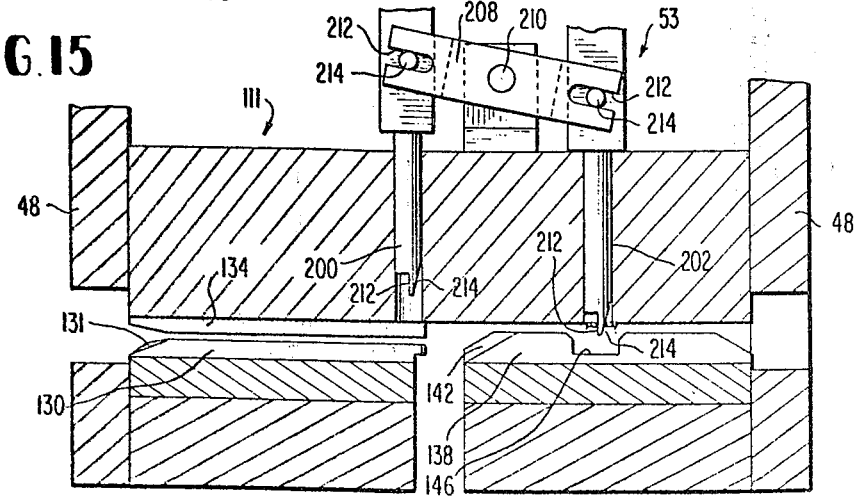

FIG. 7 is an exploded perspective view of the guide block assembly of the insertion machine of FIG. 1;

FIG. 8 is a perspective view of substitute back-up jaws that may be mounted on the guide block assembly of FIG. 7 in connection with insertion of long terminal pins;

FIG. 9 is a cross-sectional view taken along line 9—9 of FIG. 4 and showing guidance of the carrier strip at its path of travel location prior to positioning under the ram assembly;

FIG. 10 is a cross-sectional view taken along line 10—10 of FIG. 4 and illusrating the pin location prior to removal from the carrier strip;

FIG. 10A is a cross-sectional view similar to that of FIG. 10, but showing the ram assembly displaced for pin insertion;

FIG. 11 is a cross-sectional bottom plan view taken along line 11—11 of FIG. 10;

FIG. 12 is a cross-sectional front view taken along line 12—12 of FIG. 4 and showing guidance of the carrier strip at its path of travel location subsequent to positioning under the ram assembly;

FIG. 13 is cross-sectional view taken generally in the direction of lines 13—13 of FIGS. 9 and 12 and depicting displacement of the back-up jaws during a pin insertion operation, as well as the orientation of fingers of the escapement mechanism relative to the carrier strip;

FIG. 14 is a generally schematic plan view illustrating the fingers of the escapement mechanism prior to and subsequent to carrier strip advancement;

FIG. 15 is a generally schematic plan view similar to that of FIG. 14 but showing displacement of the escapement mechanism fingers to effect carrier strip advancement; and FIGS. 16 and 17 are partial perspective views showing respectively short and long pins mounted on carrier strips for insertion by the machine of FIG. 1;

DETAILED DESCRIPTION

General Structure and Operation

With particular reference now to FIGS. 1–3, a preferred form of post insertion machine 20 according to the present invention may be seen. The machine 20 includes a support base 22 for mounting the machine on a suitable floor positioned table (not shown) or the like.

Overlying and projecting outwardly from the upper face of the base 22 is a worktable like fixture 24 positioned on the base in any suitable manner. This work table fixture 24 provides a support for a manually positionable jig 26 on which a post receiving circuit board 28 may be mounted.

The jig 28, hereinafter more fully described, incorporates a safety feature to insure proper placement of an operator's hands out of the insertion area during post insertion.

The post insertion zone may be considered to be the zone extending between a post insertion ram assembly 30 and an anvil assembly 32 projecting upwardly from the support base 22 through the table-like fixture 24. During post insertion, a ram arm of the ram assembly 30, hereinafter more fully described, is operable to displace a post into a position received in a hole in the circuit board 28 located directly above the anvil assembly 32. It will also be appreciated that in accordance with the present invention, simultaneous insertion of multiple posts is also envisioned.

Each post so inserted is one of a series of posts or pins 34 mounted on a carrier strip or tape 36. (See FIGS. 16 and 17.) The strip 36 is advanced along a path of travel transverse to and intersecting the post insertion zone.

The path of travel is established to extend from a reel 37 about which the strip 36 is wound to a take-up sprocket 38 cooperable with a guide pin 39 that is removable for initial positioning of the tape on the sprocket, (See FIG. 3.) The reel 37 and the take-up sprocket 38 may be mounted in any suitable manner on the machine base 22, preferably adjacent the rear portion thereof on opposite sides of a generally upwardly projecting, and forwardly extending L-shaped support arm 40.

Suitably mounted on the upper end of this support arm 40, adjacent its most forwardly extending portion, is a working cylinder 42 of the ram assembly 30. It will be appreciated that the illustrated ram assembly 30, including this working cylinder 42, may be pneumatically or hydraulically operated through a suitable number of conduit connections such as the one schematically shown at 44 in FIG. 1.

Depending from the forwardly extending portion of the support arm 40 at a location beneath the ram assembly 30 is a guide block assembly 46, hereinafter more fully described. Attachment of this guide block assembly 46 to the support arm 40 may be accomplished by means of mounting plates 48 on opposite sides thereof. Although not illustrated, these plates may have cut out portions to permit visual access to elements disposed therebetween.

Two suitably mounted guide pulleys 50 and 51 project from the guide block assembly 46 to a location outward of the mounting plates 48. These guide or idler pulleys are positioned at a vertical level essentially coplaner with the take-up sprocket 38 and the carrier reel 37. The path of travel of the carrier strip 36, depicted in phantom in FIG. 3, is initiated by leading the strip from the reel 37 and about the first guide pulley 50, and then threading the strip through a guide channel defined by the guide block assembly 46 in a manner to be described below. The strip is then passed about the other guide pulley 51 to the sprocket 38.

At this juncture it may be noted that the guide channel of the guide block assembly 46 lies in the vertical plane which includes the axis of the ram assembly 30 and is parallel to the vertical plane that includes the axes of the guide pulleys 50. Advancement of the carrier tape 36 along that guide channel is thus operable to position pins 34 in the post insertion zone beneath an axially extensible ram arm of the ram assembly 30.

This advancement of the strip 36 may be effected by driving the take-up sprocket 38 with a suitable driving arrangement, such as an electric motor and gearing arrangement shown generally at 52 in FIG. 2 as being housed with the machine support base 22. Through this driving arrangement 52, the carrier tape 36 may be placed in tension between the guide pulleys 50 and 51, and sequentially advanced for positioning of sequential posts 34 beneath the ram assembly 30. In a manner described more fully below, particularly in connection with FIGS. 14 and 15, sequential advancement and accurate positioning of the tape and pins is controlled by means of a solenoid operated escapement mechanism 53 (not shown in FIGS. 1–3).

A suitable control circuit (not shown) is employed to effect, among other things, operation of the escapement mechanism 53 after post insertion and retraction of the ram member. In this connection, a control circuit switch 54 may be located at the side of the machine base 22.

Also positioned in that location is a take-up motor switch 56 for controlling the on or off condition of the sprocket drive 52. The take-up force exerted on the carrier strip 36 is essentially continuous with the motor switch in its on position. However, the escapement mechanism 53 prevents strip advancement except at appropriate times. Timing relationships between operation of the escapement mechanism 53 and strip movement, caused by take-up force generated by the drive 52, can be adjusted by means of a rheostat control 58 suitably electrically connected to the motor.

The Circuit Board Jig and Circuit Board Positioning

With renewed reference to FIG. 1, the preferred technique and structure for properly orienting the circuit board 28 for pin reception will be appreciated. It will be recalled that the circuit board 28 is mounted in the manually positionable jig 26.

This jig 26 may be comprised of an open rectangular frame with sides formed from interconnected L-shaped pieces of metal 60 and 61. Support legs 62 depend therefrom at suitable locations. Projecting between two opposite sides 60 of the frame are two circuit board support beams 64.

These beams 64 are transversely apertured adjacent each of their ends for reception of bars 66 which define tracks on which the beams may slide. Once proper spacing of the beams 64 is established, the beams may be locked in position on the bars 66 by means of set screws or the like (not shown) extending into holes in the tops of the beams adjacent the location of the bars 66.

The beams are also provided throughout their length with a series of further holes 68. Clamps 70 may be securely positioned on the tops of the beams by means of fasteners 72 cooperable with these holes. These clamps 70 may be stepped adjacent their edges facing inwardly of the beams 64 for reception therebeneath of the edges of the circuit board 28.

As will be appreciated, the dimensions of the circuit board 28 will govern the selected adjustable spacing between the beams 64 and the selected adjustable positioning of the clamps 70. After these locations are established, the board 28 is firmly clamped against the upper faces of the beams 64.

The board 28 includes a plurality of rows and columns (not shown in FIG. 1) of apertures for press fit or other suitable reception of a portion of the posts 34. In order to aid in proper positioning of the board apertures for such post reception, a light source 74 is provided. This light source is mounted in any suitable manner to direct a beam of light in the general vicinity of the anvil assembly 32.

The anvil assembly 32 includes a projecting locating finger 76 (See FIG. 2) at its upper end. This projecting finger or pin 76 is sized to fit into the post receiving apertures and has a diameter approximately equal thereto.

A visual indication that the manually positionable jig 26 has been properly positioned with the anvil finger 76 so received in the board aperture is provided by reflection from that finger of the beam of light established by the light source 74. When the board has not been properly positioned, the beam of light strikes solid portions of the board, producing a distinctly different visual effect.

After orientation of the board with the anvil finger 76 properly positioned in the aperture, the ram may be activiated. In order to ensure against location of an operator's hands in the pin insertion zone, activation of the ram may be controlled by two manually operable switches 77 located on opposite side legs 61 of the jig frame. As will be appreciated, suitable electrical connection can be made between these switches 77 and appropriate controls for ram activation so that ram activation is not possible unless both switches 77 are simultaneously depressed.

The Anvil Assembly

It will be recognized that in the absence of proper circuit board positioning, damage to the pins 34 as well as to the insertion machinery may result by jamming caused through engagement of the pins against solid portions of the board 28. In accordance with the present invention, ram activation is prevented unless the anvil finger 76 is properly received in a pin receiving aperture. With reference to FIG. 5 and the bottom portion of FIG. 4, the structure of the anvil assembly 32 for so preventing ram activation may be seen.

The anvil finger 76 is slidably received in a necked housing 78 of the anvil assembly 32. Below the necked portion of this housing 78 an enlarged retainer member 80, to which the anvil finger 76 is attached, is also slidably received.

This retainer member 80 is biased by a coil spring 82 located in the housing 78 between the bottom of the retainer member 80 and a lower internal housing shoulder 84. Normally, the action of the spring 82 urges the retainer member 80 against an upper internal housing shoulder 86, to maintain the anvil finger 76 projecting from the housing 78 by an amount substantially equal to the depth of an aperture in the board 28.

Projecting downwardly from the retainer member 80 through the lower end of the housing 78 is a stem 88 about which the coil spring 82 is positioned. This stem 88 may be suitably connected, adjacent its lower end protruding from the housing, to a cam member 90 or the like.

A contact member 92 of a suitable sensing means such as a microswitch 94 may be resiliently biased downwardly against the cam member 90. The biasing force of the contact member 92, is, of course, less than that which is sufficient to overcome the lifting bias on the retainer member 80 provided by the coil spring 82. However, downward movement of the retainer member 80, and the stem 88 connected thereto, displaces the cam 90 downwardly, and permits the biased contact member 92 to disengage from another microswitch contact 96 with which it is normally held in engagement.

Suitable electrical connections between the microswitch 94 and the control circuit for ram activation may be established to allow ram activation only when the micrcoswitch contacts 96 and 92 of the microswitch are engaged. In this fashion, undesirable ram activation without reception of the anvil locating finger 76 in a circuit board receiving hole will be prevented, inasmuch as with solid portions of the circuit board resting on that finger 76, the stem 88 and cam 90 will be downwardly displaced against the bias of the coil spring 82 to break contact at the switch 94.

During actual insertion of a pin 34 into a receiving hole of the circuit board 28, the portion of the pin projecting beneath the board bottom is received in the anvil housing 78 in the zone from which the locating finger 76 is downwardly displaced. In instances where jamming of a pin 34 in the anvil assembly might thereafter occur, the control circuitry is such that the resultant downward displacement of the stem 88 and cam 90 will also be operative to prevent subsequent cycles of ram activation during attempts at unjamming.

In this connection, it may be noted that the ratainer member 80 is provided with projecting arms 98 extending through slots 100 in the anvil housing 76 to permit manual displacement of the retainer member 80 and connected elements.

The Carrier Strip and Pins

With reference now to FIGS. 16 and 17, the carrier strip 36 and pins 34 for insertion in accordance with the present invention may be seen.

The elongate flexible, polyester strip 36 is generally U-shaped in transverse cross-section, and is comprised of a base portion 101 and two projecting legs 102 integral therewith. The base portion includes a series of indexing holes 103 for feeding of the strip as described below.

Each leg portion 102 is provided with a plurality of longitudinally spaced necked carrier slots 104, which support a series of pins 34 generally orthogonally to the direction of strip extent. Adjacent carrier slots 104 are separated by relief slots 105. These relief slots add flexibility to the strip.

Sequential relief slots 105 define tab portions 106 of the strip legs 102. The pins 34 are thus supported by these tabs 106 which contain the carrier slots 104.

The relatively short pins 34 illustrated in FIG. 16 are elongate members having a tail portion 107, a widened body portion 108 and a contact portion 109. The widened body portion may be press fit into the receiving apertures of the circuit board 28, with the tail portion 107 projecting therebelow.

Relatively long pins illustrated in FIG. 17 also include a tail portion 107, a widened body portion 108 and a contact portion 109. However, unlike the pins of FIG. 16, the tail portion 107 of the pins of FIG. 17 is longer than the contact portion 109.

For a purpose hereinafter more fully described the tail portions 107 of the pins of FIG. 17 are embraced by the carrier slots 104, whereas the contact portions 109 of the pins of FIG. 16 are so embraced.

In typical examples of the relative dimensions of the short and long pins 34 of FIGS. 16 and 17, the contact portion 109 of both pins would be about three eighths of an inch in length, while the length of tail portions 107 would be about one-sixteenth inch and five-eighths inch respectively.

The pins 34 may be snapped into the carrier slots 104 in any suitable manner. In this connection, reference may be had to copending U.S. patent application Ser. No. 288,851, filed Sept. 13, 1972 for further details regarding the pins 34 and carrier tape or strip 36 on which they are mounted, as well as for a general description of a technique for carrier strip advancement and displacement of the pins from the strip by a ram into press-fit reception into the circuit board. The disclosure of that application, assigned to the assignee of the present invention, is hereby incorporated by reference.

Guide Block Assembly and Carrier Tape Guidance

In FIG. 4, threading of the carrier strip or tape 36 through the guide channel defined by the guide block assembly 46 is illustrated in phantom. The manner in which this guide channel is defined and the structural members of the guide block assembly 46 are best seen in FIG. 7.

As shown therein, the guide block assembly includes a front block 110 and a rear block 111. These front and rear blocks include mating planar faces 112, 113 with assembly apertures 114 and 115 extending therethrough. These apertures are located so that when the mating planar faces 112, 113 are in abutment, the apertures 114 of the front block 110 are aligned with those 115 of the rear block 111.

The blocks may be then assembled together by machine bolts 116 (see FIGS. 9 and 12) cooperating with threads in the apertures 115 of the rear block 111. The assembly apertures 114 of the front block 110 may communicate with enlarged recesses 118 for reception of the heads of the machine bolts 116.

With the blocks 110 and 111 so assembled, a tape guiding channel having first and second sections generally indicated at 119 and 120 in FIGS. 9 and 12, is defined. As subsequently described, the configuration of the channel section 119 in the tape path of travel zone prior to passage of the tape beneath the ram assembly 30 (see FIG. 9) differs from the configuration of the channel section 120 in the tape path of travel zone after the tape passes the location of the ram assembly (See FIG. 12).

This difference in configuration of the channel sections 119 and 120 is attributable to the difference in tape configuration before and after the tape passes a ram movement zone, indicated at 122 in FIG. 13, defined generally centrally of the guide block assembly 46. In this ram movement zone 122 a ram member is operable to remove the pins 34 from the tape 36 to effect pin insertion into the board 28 as described more fully below.

In so doing, the ram member deflects the tape tabs 106 downwardly into the configuration shown in FIG. 12. The second guide channel section 120 is arranged to cooperate with the tape 36 in that deflected condition, while the first guide channel section 119 is arranged to cooperate with the tape 36 in the condition shown in FIGS. 16 and 17.

Turning now specifically to FIGS. 7, 9 and 12, the configuration of the first and second channel sections 119 and 120 may be more fully appreciated. Each of these sections 119 and 120 is defined by structure of both the front and rear blocks 110 and 111.

In connection with defining the first channel section 119, the front block 110 is provided with an insert 122.

This insert 122 is received in a generally L-shaped cut out section machined in the block 110. A groove 124 is additionally machined in the block face defined by the cutout.

The insert 122 includes a main body portion having a cross-sectional configuration substantially identical to the cross-sectional configuration of the L-shaped cut-out section. In addition, the insert 122 includes a locating flange 126 for mating reception of the insert in the L-shaped cut out section. Securing of the insert 122 in this position may be accomplished by means of machine screws 128 cooperable with suitable apertures in the inserts and the block 110.

Projecting outwardly from the insert 122 is a guiding flange 130 with a tapered lead in portion 131. As may be seen in FIG. 9, this guiding flange 130 has a height dimension substantially equal to the distance between the upper and lower legs 102 of the generally U-shaped tape 36. The width of the guiding flange 130 is sufficient so that the front face of that member projects to a location substantially adjacent the pins 34 when the tape 36 is threaded through the channel, as shown in FIG. 9.

When the tape is so threaded, the base 101 of the generally U-shaped tape 36 is positioned substantially adjacent the base of a similarly shaped recess 132 machined in the rear block 111. This recess 132 has a longitudinal extent substantially equal to the guiding flange 130 of the front block insert 122. The height of the recess 132 is substantially the same as the distance between the legs 102 of the tape.

As will be appreciated from the foregoing description of the first channel section 119, the walls of the recess 132 provide guide surfaces cooperate with the base 101 of the tape 36 and with the external portions of the tape legs 102 in their extent from that base 101 to the pins 34. Similarly, the walls of the guide flange 130 cooperate with internal portions of those tape legs 102 in their extent projecting beyond the pins 34, and with the extent of the pins 34 between the tape legs 102.

An additional portion of the front face 113 of the rear block 111 is also machined away along the length of the recess 132. In this fashion, guide rails 134 are established immediately above and below the recess 132. The width of this machined away portion of the rear block 111 is such that when the front and rear blocks 110 and 111 are assembled, the front faces of these guide rails 134 lie substantially adjacent the portions of the pins 36 projecting above and below the tape legs 102.

Thus, the first channel section 119 includes walls, provided by the rails 134, for guiding cooperation with these projecting pin portions. The guidance surfaces included in that channel section 119 are spaced and dimensioned relative to one another to provide for clearance between those surfaces and the tape 36 as well as the pins 34 at all locations. This clearance is, however, sufficiently small so that it is not shown in FIG. 9.

It will, nevertheless, be appreciated that the first channel section 119 is so defined as to limit significant excursion of the tape and pins 34 in both the vertical and horizontal planes. Similarly, twisting of the tape 36 and supported pins 34 is minimized. Although the tape 36 and pins 34 are constrained by the channel section 119, the clearance is sufficient to accomodate tape flexibility and to avoid binding during tape advancement.

Of particular significance in relation to the first channel section 119 is the essentially three location support provided for the pins 34, namely along the portions projecting above and below the tape legs 102 and along the portion therebetween. As will be noted below, by reason of the provisions made for advancement through the earlier mentioned escapement mechanism 53 (FIGS. 14 and 15) tension in the tape at the zone of the first channel section 119 is somewhat limited. Therefore, tape twisting possibility is significant. Such twisting could result in camming of the pins 34 against the guiderails 134 and subsequent forcing of the pins free from the carrier slots 104. This possibility is resisted by the guiding flange 130.

At the same time, the guide rails 134 add stability and lend rigidity to the somewhat slack tape. In this fashion, adequate tape support on the entry side of the post insertion zone (where the first channel section 119 ends) is established at a level compatible with forces generated during direct pin insertion.

At the exit side of the pin insertion zone, the second channel section 120 commences. At this channel section 120 the front block 110 is provided with another insert 136. The machining of the block for reception of this insert 136, and the actual assembly of the insert 136 are similar to that in connection with the block insert 122 associated with the first channel section 119.

The block insert 136 of the second channel 120 also includes an elongate guide flange 138. This guide flange 138 has a greater width than and a smaller thickness than the other guide flange 130.

As previously mentioned, the tabs 106 of the tape legs 102 are deflected during pin insertion. At that time, these tabs take on a set or degree of stable deformation. The orientation of the guide flange 138 in the second guide channel 120 is such that the upper wall thereof cooperates with the free end of the upper deflected tabs 106 to stabilize the tape portion from which the pins 34 have been removed.

In the portion opposite the second guide flange 138, the rear block 11 is cut away in alignment with the generally U-shaped recess 132 of the first guide channel 119. However, there is no provision for pin guidance rails such as those associated with the first guide channel, so that the resulting cut away or recess portion 140 takes on a generally inverted L-shaped configuration.

The back wall of this recess 140 provides guidance cooperation with the base 101 of the tape, while the upper recess wall provides guidance cooperation with the upper deflected tab 106 adjacent its juncture with the base 101 at which deflection occurs. At the same time, the lower deflected tab 106 is free from guidance surfaces. In this fashion, reaction forces that might be otherwise be produced be engagement of portions of the block with bottom tab 106 so as to induce twisting of the tape are avoided.

As best viewed in FIG. 7, it will be seen that the second guide flange 138 includes a lead in portion with a compound profile including a tapered portion 142 adjacent the pin insertion zone. This tapered portion 142 is operable to gradually cam the deflected upper tabs 106 of the tape upwardly in the second channel section 120. Thus, the possibilities of the introduction of twisting forces and tape feed interference by reason of snagging of non-uniformly deflected tabs 106 on the guide flange 138 are minimized, and tape uniformity is enhanced.

As in the case of the first channel section 119, the second channel section 120 is dimensioned to provide clearance for the tape. In addition, the second channel section 120, like the first section 119, is arranged to stabilize the tape against twisting and significant vertical and lateral excursions. In this connection, inasmuch as tape tension is greater in this section, the second guide channel section 120 does not require as small of a clearance between the front face of the guide flange and the adjacent moving portion, in this case the inside, of the tape base 101.

The provision in accordance with the present invention on opposite side of the pin insertion zone for tape guidance that constrains the tape, but does not induce significant drag to resist feeding, is particularly significant from the standpoint of proper positioning of the pins in the insertion zone. Uncontrolled tape deflection on either side of that zone, i.e. in the portion of the tape supporting the pins 34 or in the portion of the tape from which those pins have been removed, could result in improper alignment between the pins and the ram. The tape guide guidance channels 119 and 120 lend sufficient rigidity to the flexible tape to enable use of the tape as the sole means of support for the pins during actual insertion. Direct insertion of the pins from their support position on the tape 36 avoids the need for separate equipment to remove the pins 34 and stabilize them during insertion.

Returning again to FIG. 7, it will be seen that the rear block 111 is provided with two apertures 142 and 144 on opposite sides of the post insertion zone. It will also be noted that the guide flange 138 projecting from the second block insert 136 is provided with a recess 146 alignable with one of this apertures 144. The function of these apertures 142 and 144 and the recess 142 will be hereinafter more fully described in conjunction with the function of the earlier mentioned escapement mechanism 53.

With continued reference to FIG. 7, it may be observed that the longitudinally extending holes 148 are provided on one end of the rear block 111. These and similar holes on the other end cooperate with machine bolts (not shown) to attach the guide block assembly 46 to the mounting plates 48 for suspending that assembly from the support arm 40. (See, e.g., FIG. 1)

For a purpose described more fully below in connection with the ram assembly, the front block 110 includes a threaed hole 150 in its top surface. A set screw 151 (see FIG. 4) in that hole 150 limits ram travel.

To accomodate ram travel, the rear block 111 includes a generally T-shaped vertical groove 152 approximately centrally thereof. The front block is also grooved centrally adjacent its rear face 112 as indicated at 154 for this purpose. In addition, the front block is machined away adjacent its front face at the upper and lower portions thereof, leaving a web 156 (see FIGS. 10 and 10A) interconnecting the block portions on opposite sides of the post insertion zone.

This latter machine of the front block exposes, for viewing, the tape supported pins located in the pin insertion zone. (See, e.g. FIG. 4).

Additionally included in the block assembly 46 beneath the tape path of travel are two pivotally mounted jaws 158 and 160 mounted on the rear block 111. The function of these jaws 158, 160, and the substitute jaws shown in FIG. 8, is hereinafter more fully explained in conjuction with the description of ram insertion of the pins 34 into the board 28.

For now, it may only be noted that these jaws, generally mirror image in appearance, each are fixed to a pivot axle 162 which projects through holes in a lower zone of the rear block 111. Each of these axles 162 are suitably fixed to a bifuricated clamp member 164 by means of a set screw or the like. These clamps 164 include pins projections 166 adjacent their lower ends.

As best shown in phantom in FIG. 4, the clamps 164 are oriented at oppositely projecting 45° angles relative to the axis of the ram assembly 30. A coil spring 168 biases the clamps to that position, in which position pivot arms 170 of the jaws abut the upper surface of an inverted generally L-shaped recess 172 further cut away beyond the guide channel recesses 132 and 140.

During post insertion, the jaws 158 and 160 are pivoted about the axes defined by the axles 162 against the bias provided by the spring 168.

The Ram Assembly and Pin Removal and Insertion

In FIGS. 10 and 10A and 11, details of the ram assembly 30 may be seen. The illustrated ram assembly includes, in addition to the previously identified working cylinder 42 (FIG. 1), a reciprocable ram arm indicated at 174.

This ram arm is partially received in a tubular housing 175 that is suitably mounted in alignment with the working cylinder 42. At the upper end of the ram arm housing 175, the ram arm is operatively connected to a piston (not shown) received within and controlled by pressures within the working cylinder 42.

The lower arm of the ram arm 174 is comprised of a body section 176 and a nose section 178. This nose section 178 is defined by a reduced portion 180 of the body section and a gripping insert 182 primarily received within the body section.

As best seen in FIG. 10A, the flat insert 182 includes a main portion 184 and a nose projection 186. The main body portion 184 is the portion received in the body section 176 of the ram arm, and the nose projection 186 completes the nose section 178 of the ram arm by complementing the previously mentioned reduced portion 180.

Positioning of the insert 182 is accomplished by means of a tab 188 on its nose projection 186. This tab 188 is receivable in an opening 190 in the reduced body portion 180. In addition, the main portion 184 of the insert 182 includes a recess 192 cooperable with a set screw 193 (see FIGS. 4 and 13) and an opening in the body section 176 of the ram arm to firmly maintain the insert 182 in position.

As will be appreciated from the view of FIG. 11, the ram arm 174 has across-sectional configuration complementary to the ram arm receiving grooves 152 and 154 in the guide blocks 110 and 113. The ram arm is thus able to traverse the guide block assembly along a ram movement zone intersected by the tape path of travel zone, to remove the pins 34 and effect insertion thereof into the circuit board 28.

Upon movement of the ram arm 174 into engagement with the upper end of the pin 34 supported in the ram movement zone, the upper end of that pin is received by the nose section 178 of the ram arm as shown in FIG. 10A. In this connection, it should be noted that the nose projection 186 of the insert functions as a flexible gripping spring which accomodates reception of the pin 34 and grips that pin against the reduced body portion 180. The clearance between these two members defines a pin receiving opening of the ram arm 174.

After a given amount of downward movement of the ram arm 174, the ram arm overtakes the pin 34 until the pin is firmly seated in that receiving opening. The limit of travel of the pin into the receiving opening is established by engagement of the upper end of the pin with the positioning tab 188 of the insert 182.

With renewed reference to FIG. 7, the function of the jaws 158 and 160 during the pin removal and insertion operation may be more fully appreciated.

Upon initial engagement of the ram arm 174 with the upper end of a pin 34, the support tabs 106 will begin to deflect downwardly. Inasmuch as variations in tape tension and other tape conditions may result in non-uniformity of this deflection, and thereby produce enforced misalignment of the pin when the pin is acted on by the ram arm, it is important to insure pin alignment despite such conditions.

One function of the jaws 158 and 160 is to accomplish this. The jaws, being positioned close to the bottom end of the pin supported by the tape, resiliently engage that pin end upon a small deflection of the tabs 106.

This resilient resistance aids in accomplishing relatively uniform deflection of the tabs 106 in repeated insertion operations, thereby aiding maintenance of the pin in longitudinal alignment with the pin path of travel. The resilient resistance by the jaws to pin displacement also enforces relative movement between the pin and the ram arm 174 at a relatively controlled rate. In this manner, the pin becomes smoothly and properly seated in the pin receiving opening of the ram without being subjected to detrimental bending and twisting forces.

As will be apparent, such forces would otherwise cause the pin to be jammed against the circuit board 28 or jammed into the anvil assembly upon further downward movement of the ram arm 174.

While the magnitude of the resilient back-up force produced by the jaws is sufficient for the purposes discussed above, the force level is chosen so that undue abrasion of the pins as they rub against the jaws is avoided. It will be recognized that such rubbing is produced as the pins enter the generally V-shaped zone 194 (FIGS. 4 and 13) defined by mutually inclined faces of the jaws.

The zone 194 so defined provides an additional centering and aligning means for orienting the pin along its proper insertion path of travel.

In normal ram operation, with a circuit board 28 located properly for pin insertion, the ram arm stroke bottoms out against the circuit board. This bottoming out, coupled with the proper pin seating dimensions in the ram arm pin receiving opening, produces a correct displacement of the pin. In other words, the pin is received in the board receiving holes with proper extensions above and below the board.

However, ram actuation is sometimes undertaken, for inspection or other purposes, without a circuit board in place. In such cases, provision is made to prevent the ram arm 174 from bottoming out against the anvil assembly 32 and causing damage thereto. For this purpose, the earlier noted adjustable set screw 151 (FIG. 4) acts as a stop cooperable with a shoulder 195 (FIG. 4) of the ram arm to limits its stroke.

Much of the foregoing description has been particularly applicable to insertion of the relatively short pins from the tape depicted in FIG. 16. Operations for insertion of the long pins of FIG. 17 are essentially similar.

However, in the case of the long pins, a substitute (not shown) for the resilient ram insert 182 is provided. The substitute insert has an overall configuration similar to the one illustrated in FIG. 10A. Unlike that insert, the equivalent nose projection 186 is longer, and the body section is received higher up within the ram body. The terminus of that nose projection still is located adjacent the illustrated ram arm terminus when the substitute insert is assembled.

A positioning tab on that nose projection is also located at a level to cooperate with a second tab receiving aperture 196 (FIG. 10A).

The longer nose projection and tab location are such as to accomodate reception of the long tail section 107 of the long pin. It will be recalled that although the contact portion 109 of the short pin is acted upon by the ram, the tail portion 107 of the long pin is acted upon the ram.

In both instances it is the longer of the tail and contact portions of the pin that are acted upon and substantially fully received by the ram. The reason for this is to limit free extension of the pin to the smallest length dimension so as to minimize alignment and bending problems.

It will, however be appreciated that in the case of long pin insertion, the circuit board is positioned in an upside down posture for pin reception. This positioning is dictated by the fact that the contact portion 109 of the assembled pins are to project from the top of the circuit board, and the tail portions 107 of the pins are to project from the bottom for wire wrapping or the like.

When the longer pins of FIG. 17 are to be inserted, the jaw assembly illustrated in FIG. 8 is substitued for the jaw assembly of FIG. 7. This substitute jaw assembly includes the axles 162 and arms 170, as well as the jaws 158 and 160. However, these jaws 158 and 160 are supported by arms 198 at a sufficient level beneath the pin path of travel to accomodate for the longer length of the pins 34.

Operation of the jaw assembly of FIG. 8 is essentially the same as that of FIG. 7. It has been found that the long pin back-up jaws can be directly substituted for the short pin jaws without change of biasing springs 168 (FIG 4), and with equivalent biasing force levels consistent with the earlier described functions of the back-up jaws.

The dimensional relationships and orientations producing this result, enabling minimizing of parts and simplifying change over of operation, involve the orientation of the jaw support arms 198 and the axle clamps 164. In the case of long pin insertion, the axle clamps 164, in their rest positions are arranged to lie generally vertical rather than at the angle illustrated in FIG. 4. However, the jaw support arms 198 are mutually inclined toward one another at about an angle of 45° to the vertical.

Carrier Strip indexing and The Escapement Mechanism

In FIG. 6, the basic structure associated with the previously identified escapement mechanism 53 may be seen.

This escapement mechanism includes escapement fingers 200 and 202 receivable in the rear guide block holes 142 and 144 intersecting the tape path of travel. Each of these fingers has a tip cooperable with the carrier tape indexing holes 103 in the tape base 101.

One finger 200 is directly controlled by a solenoid 204. The other finger 202 is directly controlled by a spring 206. Longitudinal movement and positioning of both fingers are related by means of a suitably mounted pivot arm 208, pivotable about a generally vertical axis indicated at 210.

The ends of the arm 208 are bifurcated to establish slots 212 cooperable with pin projections 214 located on extensions of the escapement fingers 200 – 202. It will thus be apparent that retraction of the solenoid controlled pin 200 effects opposite movement of the other pin 202 through the pivot arm 208. Similarly, retraction of the spring controlled pin 202 effects extension of the other pin 200.

Normally, the spring 206 biases the associated pin 202 to a retracted position as shown in FIGS. 6 and 14. This places the other pin 200 in its extended position where its tip is received within a tape indexing hole 103.

In this extended position that pin 200 prevents the tape from feeding despite the continuous feeding force generated by the driven sprocket 37. At the same time, engagement of that pin with the tape necessarily isolates the tape section leading up to that pin from some of the feed tension. As earlier noted, special tape guidance is established in the first guide channel section 119 to minimize problems associated with this tension isolation.

It is important to note that since the relative location of the solenoid controlled finger 200 is upstream of the pin insertion zone, this finger 200 does not isolate feed tension transmission to the tape portion supporting the pin at the pin insertion zone. It will be recalled that the tape guide channel sections terminate adjacent the pin insertion zone. Therefore, the solenoid controlled finger 200 is located close to that zone to give added stability. Imparted by transmitted tension, to the tape in that zone.

After the ram is activiated to effect direct insertion of a pin, and the ram arm 174 is retracted, the solenoid 204 is activated to retract its associated finger. Suitable circuitry (not shown) is provided to accomplish this automatically.

In FIG. 6 a microswitch indicated at 216, is shown. This switch 216 is operable to time ram movement in relation to tape indexing caused by operation of the solenoid 204. In this fashion, ram activation in the absence of proper indexing may be prevented.

When the solenoid retracts the one finger 200, the other finger 202 is extended against the bias of its associated spring 206. De-energizing of the solenoid enables that spring 206 to retract its finger 202 and permits extension of the other pin 200.

From the foregoing, and with reference to the schematic illustrations in FIGS. 14 and 15 it will be apparent that alternate extension and retraction of the escapement fingers 200, 202 produces sequential indexing of the tape to sequentially position each tape carried pin 34 in the insertion zone.

The timing of an indexing operation to ensure proper unit indexing may be adjusted by operation of the earlier mentioned rheostat control 58 for the tape drive 52. This raises or lowers the speed at which the tape advances at that point in time when both fingers are disengaged from the indexing holes 103. Thus, after the solenoid controlled finger 200 is retracted, the tape is released for a time for feeding at a proper rate so that the other finger 202 engages the next in line indexing hole 103 to temporarily terminate tape advancement.

From FIGS. 14 and 15 it will be seen that the tips of the escapement fingers 200 and 202 are defined by a straight shoulder 212 and a tapered shoulder 214. The dimensions of these tips and their relative spacing, as well as the relative size and spacing of the indexing holes 103, are such that after tape advancement is temporarily terminated, subsequent solenoid de-energization results in the finger 200 re-engaging the tape 36 in a time less than that in which the tape feed speed would cause the next indexing hole to by-pass that finger.

The next pin is thus placed in position for insertion.

GENERAL SUMMARY OF ADVANTAGES

From the foregoing, it will be apparent that in accordance with the present invention, a novel and advantageous method and apparatus for inserting terminal pins in a substrate has been provided.

Of particular significance is the provision for carrier strip guidance on opposite sides of a pin insertion zone so as to accomodate strip flexibility while conditioning the strip for direct insertion. In this connection, the guide channel sections of the guide blocks may be specifically defined to accomodate the strip sections with and without the pins.

Also of importance is the provision for resilient back-up forces with back-up jaws to aid in proper pin orientation during insertion.

Additionally, the escapement mechanism advancement control to insure proper positioning for insertion provides further advantages.

Cooperation between the anvil assembly and the circuit board enhances pin alignment with the pin receiving holes of the circuit board. In this connection, disabling of the ram assembly, except during proper board positioning minimizes the possibility of damage.

Although the present invention has been described in connection with preferred forms thereof, it will be appreciated that additions, modifications, substitutions and deletions may be made without departing from the spirit and scope of the invention as defined in the appended claims.

What is claimed is:

1. Apparatus for advancing a terminal carrier strip along a guided path of travel, the apparatus comprising:
   feed means operable to apply tension to the strip urging the strip in an advancing direction of travel; and
   escapement means for controlling advancement of the carrier strip along the path of travel, said escapement means including:
      first and second escapement finger means alternately engageable with the strip; and
      each of said first and second finger means being arranged, when in engagement with said strip, to resist said tension and prevent advancement of said strip by said feed means; and
      escapement finger control means establishing alternate engagement of said first and second escapement finger means with the strip, to provide incremental advancement of the strip by said feed means during a period when both of said finger means are disposed out of engagement with said strip.

2. Apparatus according to claim 1 including:
   feed control means for adjusting the tension applied by said feed means in relation to the timing of operation of said escapement finger control means to adjust the amount of incremental advancement of the strip.

3. Apparatus according to claim 1 wherein said escapement finger control means comprises:
   biasing means for biasing said second escapement finger means out of engagement with the strip;
   selectively operable means operable in one condition to move said first escapement finger means out of engagement with the strip, and operable in a second condition to permit movement of said first escapement finger means into engagement with the strip; and
   finger linkage means for moving each of said first and second escapement finger means in opposite directions in response to enforced movement of the other of said first and second finger means.

4. Apparatus according to claim 1 wherein the carrier strip has indexing apertures engageable by said first and second escapement finger means, and wherein:
   said first and second escapement finger means include tips with inclined faces, receivable in the strip indexing apertures.

5. Apparatus for insertion of terminals into a substrate, the apparatus comprising:
   ram means operable to insert the terminals into the substrate;
   an anvil assembly aligned with said ram means and cooperable with the substrate to effect terminal insertion, said anvil assembly including:
      housing means including a receiving opening for receiving a portion of an inserted terminal projecting below the substrate, and
      locating finger means movably mounted in the receiving opening of said housing means,
      said locating finger means being urged toward an outwardly projected position and being sized for reception by a terminal receiving aperture of the substrate, and
   sensing means operably connected between said anvil assembly and said ram means and being actuable in response to displacement of said locating finger means from its outwardly projected position to disable activation of said ram means.

6. Apparatus according to claim 5 including:
   indicating means comprising a lamp for directing a light beam toward said aperture of the substrate to provide a visual indication of reception of said locating finger means by a terminal receiving aperture of the substrate.

7. Apparatus for insertion of terminals into a substrate, the apparatus comprising:
movable ram arm means engageable with terminals for insertion thereof into the substrate;
said ram arm means including a nose section comprised of an integral body section having coupled thereto a removable resilient insert for defining a terminal receiving aperture opening therebetween, for resiliently gripping a received terminal;
said body section including an aperture;
said insert including a tab extending generally transversely relative to the direction of ram movement and into said aperture;
securing means engaging said insert at a location remote from said tab to hold said insert in place;
said tab defining a shoulder limiting the depth of reception of the terminal in said terminal receiving opening; and
said nose section further including apertures cooperable with selected inserts for varying the location of said shoulder.

8. Apparatus according to claim 7 including:
selectable, resiliently biased, pivotal bank-up jaws disposed adjacent the path of travel of said ram arm means to engage terminals being inserted and constrain movement thereof into said terminal receiving opening in a controlled manner.

9. Apparatus according to claim 8 wherein:
said back-up jaws are selected in relation to the selected said inserts.

10. Apparatus according to claim 9 including:
a single spring means providing the resilient bias for each of said selectable back-up jaws.

11. A method of advancing a terminal carrier strip along a guided path of travel passing a terminal removal zone, the method compising:
applying continuous tension to the strip at a location disposed downstream of said terminal removal zone to urge the strip in an advancing direction along the path of travel; and
engaging the strip with an escapement mechanism to apply resisting forces to the strip at a location disposed upstream of said terminal removal zone to resist advancement of the strip, while permitting transmission of tension along the strip at least to the terminal removal zone during terminal removal.

12. The method according to claim 11 including the step of:
providing support for a plurality of terminals in the path of travel prior to the terminal removal zone in order to resist lateral separation of terminals from the strip.

13. In a method of ram insertng of terminals supported by a strip into a substrate, the improvement comprising:
providing a zone for location of the substrate for terminal reception,
inserting a substrate into said zone such that an aperture of said substrate is disposed in the vicinity of a movable sensing finger that is operably connected to a power control mechanism for the ram; and
employing said finger to condition activation of the ram by: disabling ram activation in response to sensing of improper substrate location.

maneuvering said substrate and said finger relative to one another from
an improperly disposed orientation wherein said aperture and pin are unaligned causing depression of said finger to disable ram activation, to
a proper orientation wherein said aperture and pin are aligned, permitting extension of said finger into said aperture to allow ram activation.

14. A method of establishing a path of travel for a terminal carrier strip, said strip being comprised of a flexible elongate member of generally U-shaped cross section defined by a base and contiguous spaced legs having support portions deflectable by ram means operable to remove terminals from the strip and directly insert them into a substrate, said support portions of the legs releasably mounting a plurality of terminals generally orthogonally to strip extent, with the terminals extending between and projecting beyond both legs, the method comprising:
establishing first and second guide channel sections separated by a terminal removal and insertion zone,
constraining the carrier strip path of travel in the first guide channel section by:
passing the carrier strip along guide surfaces formed in a first support portion which:
guide the base of the carrier and the external portions of both carrier strip legs along their extent from that base to the terminals, and
guide projecting portions of the terminals extending from the carrier strip legs; and
simultaneously passing the carrier strip along guide surfaces formed in a second support portion spaced from said first support which:
guide the internal portions of both carrier strip legs along their extent projecting beyond the terminals, and
guide an extent of the terminals situated between the carrier strip legs and facing away from the base of the carrier strip;
constraining the carrier strip path of travel in the second guide channel section by:
passing the carrier strip along guide surfaces formed in said first support portion which:
guide the base of the carrier strip and deflected portions of one of the strip legs adjacent their juncture with that base, while deflected portions of the other strip legs remain essentially free from guidance, and
simultaneously passing the carrier strip along a guide surface formed in said second support portion which:
guides the deflected portions of said one of the strip legs adjacent their ends;
the constraint of the carrier strip path of travel in the first and second sections being sufficient to constrain the carrier strip and supported terminals against significant twisting and significant excursion laterally and transversely of the extent of the strip threaded in said guide channel, while providing clearance accommodating flexibility of the strip and limiting binding during travel thereof.

15. The method according to claim 14 including the step of:
yieldingly resisting removal of terminals from the strip to substantially uniformly control deflection of the support portions thereof.

16. The method according to claim 14 including the step of:
- camming the deflected portions of the strip into a generally uniform orientation in the second section of the guide channel.

17. The method according to claim 14 including the steps of:
- applying continuous tension to the strip to urge the strip in an advancing direction through the guide channel sections; and
- controlling incremental advancement of the strip, while permitting transmission of tension throughout the strip in said second guide channel section and said terminal removal zone.

18. Apparatus for insertion of terminals into a substrate, the apparatus comprising:
- movable ram arm means engageable with terminals for insertion thereof into the substrate;
- said ram arm means including a nose section having a terminal receiving opening defined by means, including a removable resilient insert, for resiliently gripping a received terminal;
- said insert having a shoulder limiting the depth of reception of the terminal in said terminal receiving opening;
- said nose section further including apertures cooperable with selected inserts for varying the location of said shoulder; and
- selectable, resiliently biased, pivotable back-up jaws selected in relation to the selected insert and being disposed adjacent the path of travel of said ram arm means to engage terminals being inserted and constrain movement thereof into said terminal receiving opening in a controlled manner.

\* \* \* \* \*